United States Patent [19]
Pascucci

[11] Patent Number: 5,946,237
[45] Date of Patent: Aug. 31, 1999

[54] NONVOLATILE MEMORY DEVICE CAPABLE OF READING DATA WITH A REDUCED NUMBER OF WORD LINES

[75] Inventor: Luigi Pascucci, Sesto San Giovanni, Italy

[73] Assignee: SGS-Thomson Microelectronics S.r.l., Agrate Brianza, Italy

[21] Appl. No.: 08/826,489

[22] Filed: Mar. 27, 1997

[30] Foreign Application Priority Data

Mar. 29, 1996 [EP] European Pat. Off. .............. 96830162

[51] Int. Cl.$^6$ .................................................. G11C 16/06
[52] U.S. Cl. .................................. 365/185.2; 365/185.09; 365/185.11; 365/185.25; 365/210; 365/233; 365/194
[58] Field of Search ........................... 365/185.2, 185.11, 365/185.09, 185.25, 210, 233, 194

[56] References Cited

U.S. PATENT DOCUMENTS 5,022,009  6/1991  Terada et al. ............................ 365/210

FOREIGN PATENT DOCUMENTS

| | | | |
|---|---|---|---|
| A-0 151 083 | 8/1985 | European Pat. Off. .......... | G11C 7/00 |
| A-0 175 101 | 3/1986 | European Pat. Off. ........ | G11C 11/24 |
| A-0 422 939 | 4/1991 | European Pat. Off. .......... | G11C 7/00 |
| A-0 437 791 | 7/1991 | European Pat. Off. ........ | G11C 16/06 |
| A-0 470 719 | 2/1992 | European Pat. Off. ........ | G11C 16/06 |
| A-0 655 742 | 5/1995 | European Pat. Off. ........ | G11C 16/04 |

OTHER PUBLICATIONS

European Search Report from European Patent Application 96830162.2, filed Mar. 29, 1996.

IEEE International Solid State Circuits Conference, vol. 36, Feb. 1993, New York US, pp. 42–43, Rosendale et al., "A 13ns Mb CMOS EPROM Using 1–T FAMOS Technology".

Primary Examiner—Andrew Q. Tran
Attorney, Agent, or Firm—Wolf, Greenfield & Sacks P.C.

[57] ABSTRACT

A data reading path management architecture for a memory device, particularly of the non-volatile type, comprising a memory matrix and data sensing component that are adapted to receive the data of the memory matrix for reading, which has the particularity that the memory matrix is divided into at least two half-matrices. Each one of the two half-matrices has a reference line that is adapted to constitute a reference for reading the other half-matrix. The data sensing component receives the data from one half-matrix and the reference from the other half-matrix and is adapted to transmit, according to a control timing, the data on an internal bus.

42 Claims, 4 Drawing Sheets

NONVOLATILE MEMORY DEVICE CAPABLE OF READING DATA WITH A REDUCED NUMBER OF WORD LINES

BACKGROUND OF THE INVENTION

1. Field of the Invention

The present invention relates to a data reading path management architecture for a memory device, particularly of the non-volatile type.

2. Discussion of the Related Art

In a non-volatile memory, it is important to be able to provide architectures that perform data extraction as quickly as possible and in a reductive embodiment.

One of the solutions that is adopted most frequently is to associate a reference bit line with each bit of a word, so as to provide each selection line with a cell whose conductivity characteristics are fully similar to those of a generic virgin matrix cell, and at the same time, repeat the capacitive load of a corresponding bit line.

A drawback of this solution is the fact that it is not possible to repeat, in a simple way, the load of the entire selection path, such as for example a column multiplexer. Furthermore, the two selected cells (the matrix cell and the reference cell) are at a different distance from the same word line, with a consequent possible difference in signal level.

This drawback is lessened by using static sense amplifiers, in which one waits for the steady-state condition to be reached before proceeding with the reading operation. The use of these sense amplifiers, however, results in a waste of time for reading, since it is unable to dynamically lock the timing of the reading operation to the actual conductivity of a memory cell, i.e., to the signal level that is present therein.

On the other hand, the use of dynamic sense amplifiers is heavily penalized by the above mentioned drawback and by the additional inequality of the capacitive-resistive load of the lines. Furthermore, the architectures of conventional memory devices comprise, for redundancy management, redundancy line groups whose reference is constituted by the same reference columns used for the normal lines of the memory matrix. In this manner, the redundancy bit lines are also compared with the corresponding reference lines, but if a bit is defective on a reference line, then the memory device is defective and must be rejected because it is impossible to change the reference, due to the presence of reference columns, one for each word bit of the memory.

SUMMARY OF THE INVENTION

One aim of the present invention is therefore to provide a data reading path management architecture for a memory device, particularly of the non-volatile type, that balances the read paths of the memory matrix side and of the reference side and the selection paths.

Within the scope of this aim, an object of the present invention is to provide a data reading path management architecture for a memory device, particularly of the non-volatile type, that allows a reduced number of reference lines.

Another object of the present invention is to provide a data reading path management architecture for a memory device, particularly of the non-volatile type, that detects the event of full propagation of a generic word line and at the same time assigns a corresponding reference cell to each bit line.

Another object of the present invention is to provide a data reading path management architecture for a memory device, particularly of the non-volatile type, that achieves synchronous propagation of the signals on the lines and therefore both on the reference cells and on the matrix cells.

Another object of the present invention is to provide a data reading path management architecture for a memory device, particularly of the non-volatile type, that enables and disables data transfer from the memory on a bus structure.

Another object of the present invention is to provide a data reading path management architecture for a memory device, particularly of the non-volatile type, that provides redundancy even for any defective bits of the reference lines.

Another object of the present invention is to provide a data reading path management architecture for a memory device, particularly of the non-volatile type, that produces paths for reproducing the normal propagation delays and paths within a memory matrix, for optimum balancing of the structure.

Another object of the present invention is to provide an architecture that is highly reliable and relatively easy to manufacture at competitive costs.

This aim, these objects, and others that will become apparent hereinafter are achieved by a data reading path management architecture for a memory device, particularly of the non-volatile type, comprising a memory matrix and data sensing means that are adapted to receive the data of the memory matrix for reading, characterized in that the memory matrix is divided into at least two half-matrices, each one of said two half-matrices having a reference line that is adapted to constitute a reference for reading the other half-matrix, the data sensing means receiving the data from one half-matrix and the reference from the other half-matrix, the data sensing means being adapted to transmit, according to a controlled timing, the data on an internal bus for their transmission from the memory matrix.

This aim, these objects, and others are furthermore achieved by a method for reading a memory device, particularly of the non-volatile type, that comprises at least two memory half-matrices, characterized in that it comprises the steps of:

- precharging the two branches of data sensing means to their operating level, and equalizing said two branches so as to hold the data in the data sensing means in response to a pulsed read address transition signal;
- producing a signal for disabling access to an internal bus for the transmission of the data of the memory device;
- releasing the equalization of the two branches of the sense amplifier to allow transmission the data of the at least two memory half-matrices; and
- enabling the access of the data to the internal bus for the transmission of the data from the memory matrix.

According to another embodiment of the present invention, a system for balancing read paths of a memory device is disclosed, the system comprising first and second memory half matrices, each including a plurality of memory cells, data sensing means having a first input coupled to receive data from the first memory half-matrix and a second input coupled to receive data from the second half-matrix and means for selecting, when a memory cell of the first half-matrix is selected from reading, a corresponding memory cell of the second half-matrix. The selecting means comprises one reference line in each half-matrix, whereby, when one memory cell is selected in the first half-matrix for reading, the reference line of the second half-matrix activates a corresponding reference memory cell of the second half-matrix, thereby providing, to the data sensing means, data from the first half-matrix and a corresponding reference from the second half-matrix. The data sensing means comprises a plurality of sense amplifiers, each having a first output for transmitting data read from the first half-matrix to the internal bus, and a second output for transmitting data read from the second half-matrix to the internal bus. The system further comprises logic means for selecting one of the first and second outputs of each of the sense amplifiers and means for enabling and disabling access of the internal bus by the first and second outputs of each of the sense amplifiers. Each of the first and second half-matrices comprises redundancy lines, each of the first and second half-matrices are divided into a plurality of half matrix subsections that are driven by hierarchical decoding means. The number of data sensing means is equal to a number of word bits of word lines of the first and second half-matrices.

BRIEF DESCRIPTION OF THE DRAWINGS

Further characteristics and advantages of the invention will become apparent from the description of a preferred but not exclusive embodiment of the architecture according to the invention, illustrated only by way of non-limitative example in the accompanying drawings, wherein.

DETAILED DESCRIPTION

Figure 1:
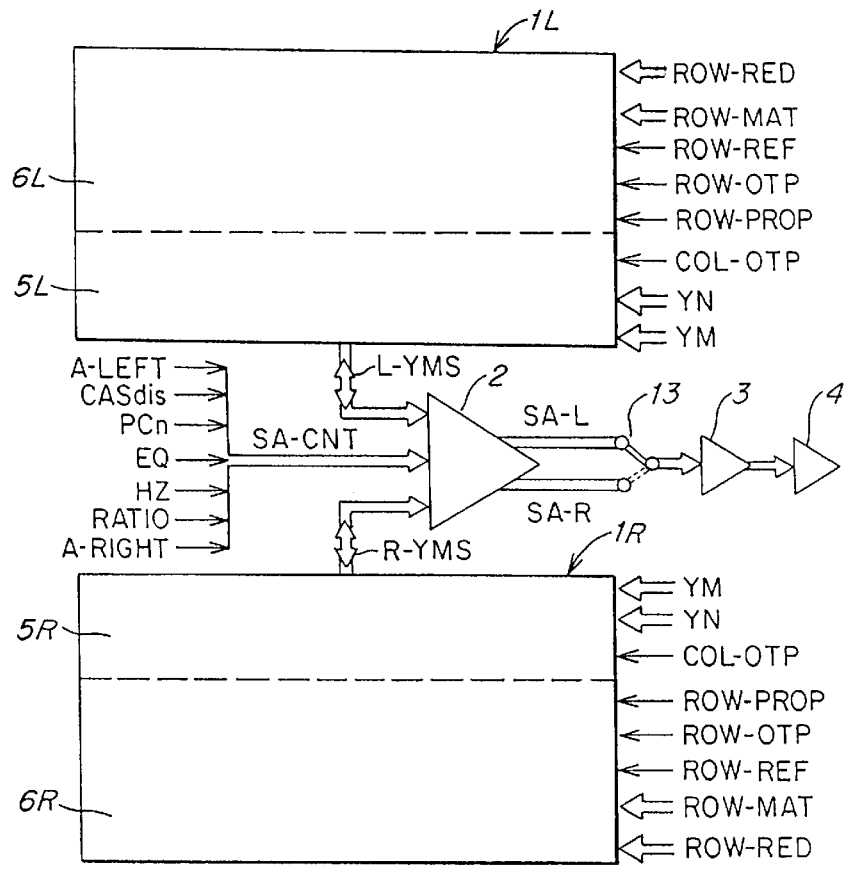
FIG. 1 is a block circuit diagram of a data reading path management architecture according to the invention.

With reference to the above figures, and particularly to FIG. 1, reference numerals $1_L$ and $1_R$ designate respectively the left half-matrix and the right half-matrix of a memory device, particularly of the non-volatile type. The reference numeral 2 designates data sensing means, advantageously provided by a sense amplifier that is adapted to capture the data from the memory. In practice, reference numeral 2 designates a plurality of sense amplifiers, whose number is equal to the number of bits of the words of the memory matrix. If one has a memory matrix that has, for example, 16-bit words, there are 16 sense amplifiers and a sense amplifier for redundancy, if provided.

It should be noted that the memory matrix can be divided into any number of half-matrices, not necessarily two. Each memory half-matrix 1 (i.e., both $1_L$ and $1_R$) is divided into four subsections, since a matrix line selection approach employing a hierarchical decoder (not shown) is used.

For the sake of convenience in description, reference will be made hereinafter to a single sense amplifier; this remark also applies to all the structures that are connected thereto.

Each memory half-matrix 1 is connected by means of a data bus that is adapted to connect the selected bit line of the memory matrix. This bus is designated by L-YMS for the left half-matrix and by R-YMS for the right half-matrix. A control bus, designated by SA-CNT, is connected at an input to the sense amplifier 2 and carries several signals for controlling the memory device.

In particular, the signals are as follows:

A-LEFT: address that indicates reading of the left half-matrix $1_L$;

A-RIGHT: address that indicates reading of the right half-matrix $1_R$;

PCn: inverted signal related to the precharging of the nodes involved in the reading operation;

EQ: equalization signal;

HZ: signal for enabling/disabling access to an internal bus by the sense amplifier 2 for transmission of the data of the memory on the internal bus;

RATIO: signal that indicates a mirroring ratio used in a reference system (not shown) that is adapted to check the status (programmed or virgin) of a memory cell;

CAS-dis: signal for enabling/disabling biasing structures (not shown) used in the reference system.

The sense amplifier 2 has two outputs for transmitting on the internal bus (not shown) the data of left half-matrix $1_L$ and of the right half-matrix $1_R$. These outputs are designated by SA-L and SA-R respectively. The outputs of the sense amplifier 2 are enabled or disabled for subsequent transfer by enabling/disabling means 3, which is adapted to enable/disable the passage of the data of the left half-matrix $1_L$ or of the right half-matrix $1_R$. The means 3 are provided by means of tristate structures.

The enabling/disabling of the outputs of the sense amplifier 2 is provided by enabling/disabling means 3 that receives as inputs the outputs SA-R and SA-R of the sense amplifier 2 and the signals LEFT and RIGHT for indicating reading of the left half-matrix $1_L$ or of the right half-matrix $1_R$.

After passing through the enabling/disabling means 3, the outputs of the sense amplifier are introduced to means 4 for enabling/disabling access to the internal bus (not shown) for the transfer of the data captured from the memory matrix (by means of the sense amplifier 2) to the internal bus. The means 4 for enabling/disabling access of the data to the internal bus are also provided by means of tristate structures.

With reference again to the memory matrix divided into the two half-matrices $1_L$ and $1_R$, for each one of the half-matrices it is possible to identify a first portion 5 and a second portion 6 ($5_L$, $5_R$; $6_L$, $6_R$). The first portion, $5_L$, $5_R$, comprises means for selecting the bit lines of the matrix, which are provided by a multiplexer constituted by two selection buses YM and YN.

In this first portion $5_L$, $5_R$, there is also a column, designated by OTP, which represents a one-time programmable column that is useful during the checking of the integrity of the memory device for devices which, despite being writable and erasable, are however inserted in plastic cases that do not have the necessary hole for the passage of ultraviolet A(UVA) rays for memory erasing. The signal that controls this column is designated COL-OTP.

The second portion $6_L$, $6_R$ of each memory half-matrix contains the word lines of the matrix, designated by ROW-MAT, the matrix redundancy lines ROW-RED, a propagation line ROW-PROP adapted to reproduce the propagations of the signals from one cell to the next of the memory device, a reference line (only one for each half-matrix)

ROW-REF, and a line ROW-OTP whose function is similar to the column OTP (COL-OTP) described earlier.

Figure 2:
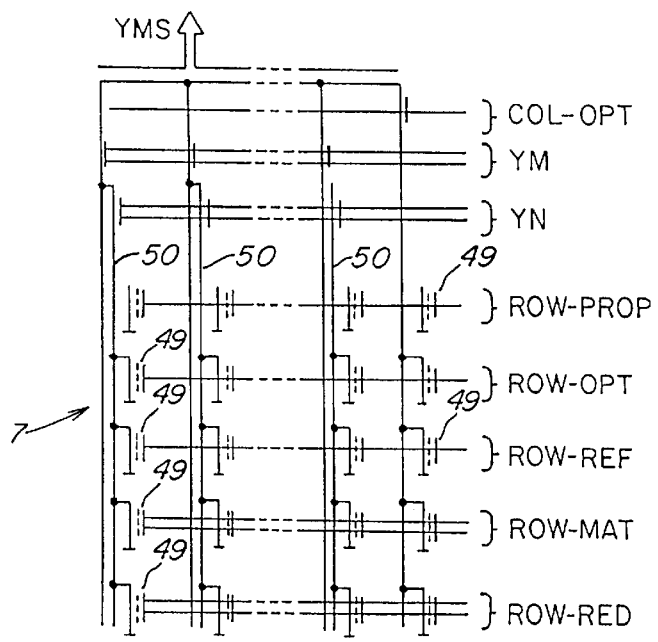
FIG. 2 is a schematic diagram of a portion of a memory matrix executed by means of the architecture according to the invention.

FIG. 2 is an example of a configuration of one of the word bits of a memory matrix. The reference numeral 7 designates the bit.

The elements designated by 49 are floating-gate transistors constituting the memory cells for the matrix lines ROW-MAT, for the redundancy lines ROW-RED, for the propagation reproduction line ROW-PROP, for the reference line ROW-REF, and for the line ROW-OTP. The reference numerals 50 designate the bit lines. It can be seen that the propagation line ROW-PROP is disconnected from the bit lines 50, whereas all the other lines (ROW-OTP, ROW-REF, ROW-MAT, and ROW-RED) are connected to the bit lines.

Figure 3:
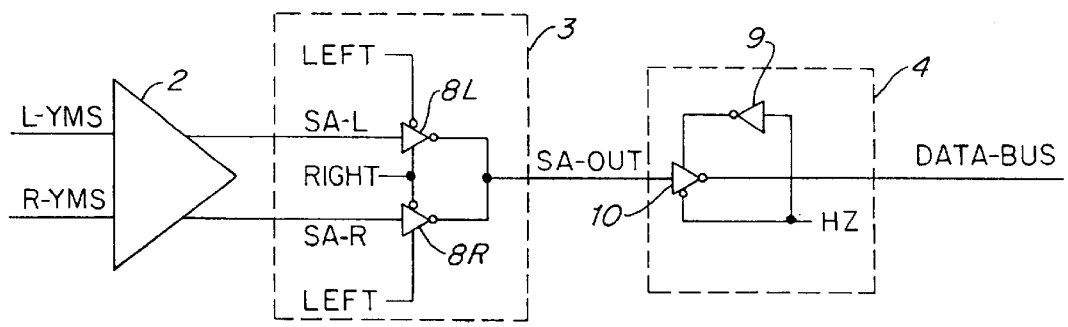
FIG. 3 is a schematic diagram of a first embodiment of the connection of a sense amplifier to the internal bus in accordance with the architecture according to the invention.

FIG. 3 is a view of the sense amplifier 2, which receives the lines L-YMS and R-YMS that are adapted to send to the sense amplifier the data of the bit line selected respectively in the left half-matrix $1_L$ and in the right half-matrix $1_R$. The outputs SA-L and SA-R of the sense amplifier 2 are sent to the means 3 for enabling/disabling the transit of the left half-matrix $1_L$ or of the right half-matrix $1_R$.

Means 3 comprise a first tristate structure $8_L$ and a second tristate structure $8_R$. The tristate structures $8_L$ and $8_R$ receive, respectively, the line SA-L, and the line SA-R. Both structures $8_L$ and $8_R$ receive the signal LEFT and the signal RIGHT. The signal output from the tristate structures $8_L$ and $8_R$, designated by SA-OUT, is sent to the means 4 for enabling/disabling access to the internal bus, designated by DATA-BUS.

Means 4 comprises a tristate structure 10 that receives the signal SA-OUT and the signal HZ for enabling/disabling the transmission of data on the internal bus DATA-BUS. The tristate structure 10 receives, at the gate terminal of an N-channel transistor, the signal HZ, which is inverted by means of an inverter 9, whereas the same signal HZ is sent, without being inverted, to the gate terminal of a P-channel transistor of the tristate structure 10.

Figure 4:
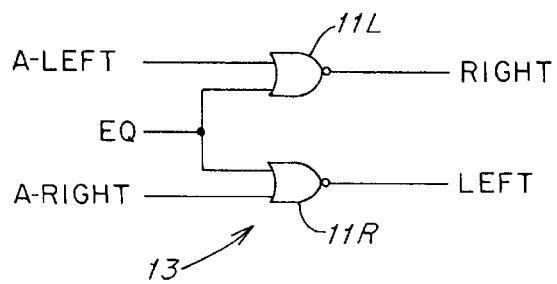
FIG. 4 is a schematic diagram of a first embodiment of a circuit for producing read signals of a left half-matrix or of a right half-matrix of the memory device.

FIG. 4 shows in detail the logic means 13 for generating the signals LEFT and RIGHT. Logic means 13 comprises a first NOR gate $11_L$ receiving the signal A-LEFT and the equalization signal EQ, and a second NOR gate $11_R$ receiving the signal A-RIGHT and the equalization signal EQ. The output of the NOR gate $11_L$ is the signal RIGHT, whereas the output of the logic gate $11_R$ is the signal LEFT.

Figure 5:
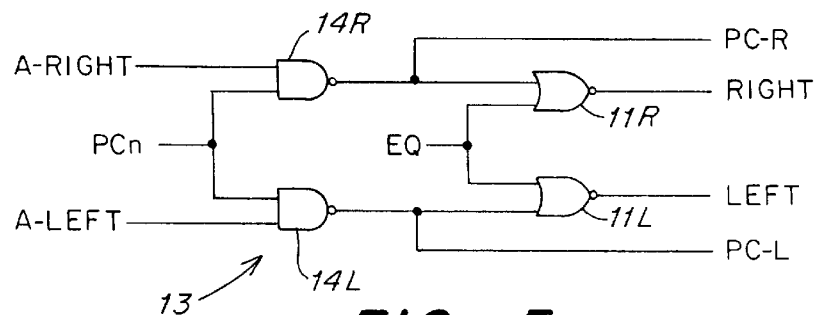
FIG. 5 is a schematic diagram of a second embodiment of the circuit shown in FIG. 4.

FIG. 5 is a view of a second embodiment of the logic means 13, in which said logic means comprises a first NAND gate $14_R$, which receives the signal A-RIGHT and the signal PCn (inverted precharging signal); a second NAND gate $14_L$, which receives the signal A-LEFT and the signal PCn; and the two NOR gates $11_L$ and $11_R$ that have already been described.

The outputs of the two NAND gates $14_L$ and $14_R$ are, respectively precharging signal PC-L and precharging signal PC-R (respectively the left side precharging signal and the right side precharging signal). NOR gate $11_R$ receives the output signal of the NAND gate $14_R$ and the equalization signal EQ. The NOR gate $11_L$ receives in input the output signal of the NAND gate $14_L$ and the equalization signal EQ. The outputs of the NOR gates $11_R$ and $11_L$ are the signals RIGHT and LEFT respectively.

Figure 6:
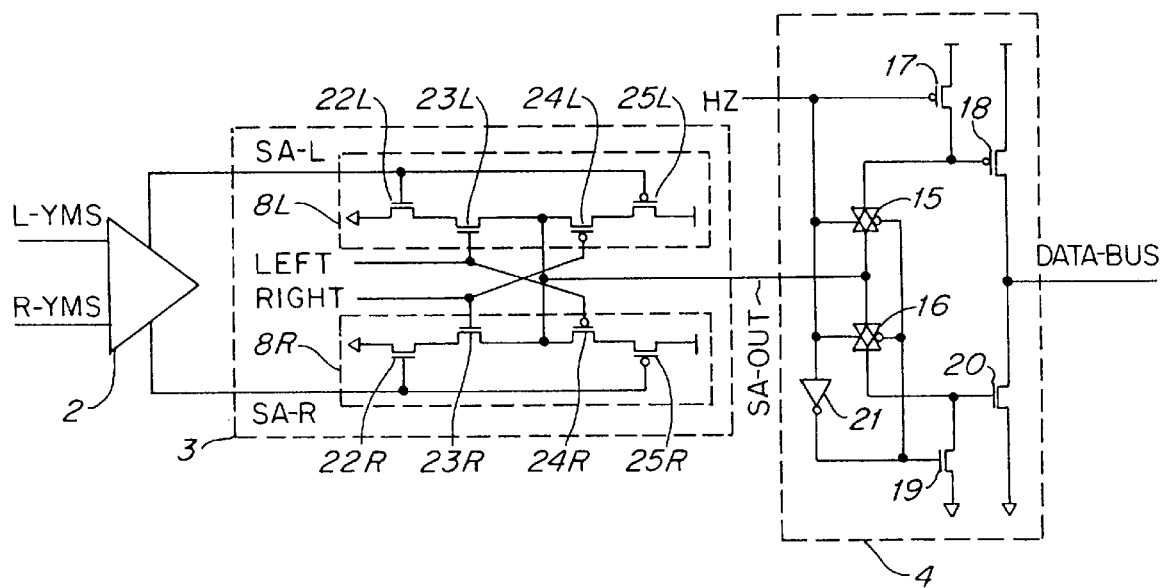
FIG. 6 is a schematic diagram of a second embodiment of the circuit shown in FIG. 3.

FIG. 6 shows a second embodiment of the circuit of FIG. 3, in which the means 4 for enabling/disabling access to the internal bus DATA-BUS are provided by means of a particular tristate structure that is adapted for driving high capacitive loads.

The particular tristate structure which constitutes means 4 comprises a first pair of pass transistors and a second pair of pass transistors, designated by 15 and 16, which are constituted by a P-type transistor and by an N-type transistor respectively. Furthermore, means 4 comprises two P-type transistors 17 and 18 and two N-type transistors 19 and 20, in addition to an inverter 21.

In detail, in the transistor 17 the source terminal is connected to the supply voltage and the drain terminal is connected to the gate terminal of the transistor 18, which is in turn connected to the two pass transistors 15. The signal HZ is sent to the gate terminal of the transistor 17. The drain terminal of the transistor 20 is connected to the drain terminal of the transistor 18 and its source terminal is connected to the ground. The gate terminal of the transistor 20 is connected to the pair of pass transistors 16.

The signal HZ is sent to the gate terminals of the N-type transistors of the pairs of pass transistors 15 and 16, whereas the inverted signal HZ is sent to the gate terminals of the P-type transistors of the pairs of pass transistors 15 and 16.

The gate terminal of transistor 19 is connected to the output of the inverter 21, the source terminal is connected to the ground, and the drain terminal is connected to the gate terminal of the transistor 20. The signal SA-OUT, from the data transit enabling/disabling means 3, is sent in input to the pairs of pass transistors 15 and 16.

The tristate structures $8_L$ and $8_R$ are furthermore shown in detail in FIG. 6. Tristate structure $8_L$ comprises a pair of transistors $22_L$ and $23_L$ of the N-channel type and a pair of transistors $24_L$ and $25_L$ of the P-channel type. The source terminal of transistor $22_L$ is connected to the ground, the drain terminal is connected to the source terminal of transistor $23_L$, and the gate terminal receives the signal SA-L. The gate terminal of transistor $23_L$ receives the signal LEFT and the drain terminal is connected to the drain terminal of transistor $24_L$. The gate terminal of transistor $24_L$ receives the signal RIGHT and the source terminal is connected to the drain terminal of transistor $25_L$. The source terminal of transistor $25_L$ is connected to the supply voltage and the gate terminal receives the signal SA-L.

The enabling/disabling means $8_R$ has a structure that is identical to means $8_L$, except for the fact that transistor $23_R$ (which matches the transistor $23_L$) receives the signal RIGHT at its gate terminal and transistor $24_R$ (which matches the transistor $24_L$) receives the signal LEFT at its gate terminal.

Figure 7:
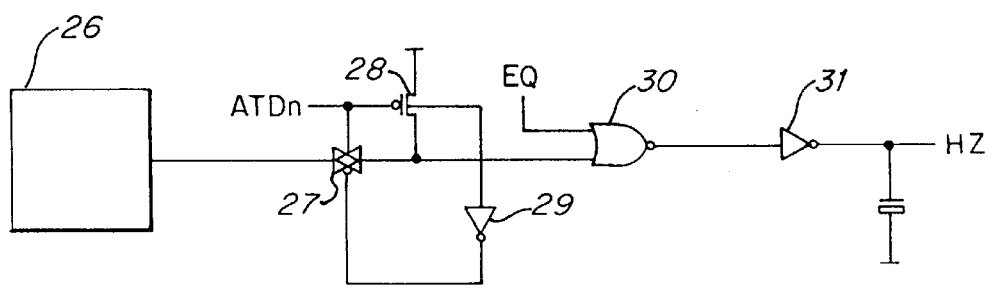
FIG. 7 is a schematic diagram of a circuit for generating a signal for enabling and disabling access to the internal bus for the transmission of the data that arrive from the memory matrix.

FIG. 7 shows in detail a possible circuit for generating the signal HZ for enabling the transmission of data on the internal bus DATA-BUS. The circuit of FIG. 7 comprises means 26 for controlling the generation of the signal HZ and a pair of pass transistors that receives at the gate terminal of its N-type transistor, an inverted address transition detection signal ATDn, which is also sent to the gate terminal of a P-channel transistor 28. The source terminal of transistor 28 is connected to the supply voltage and the drain terminal is connected to the output of the pair of pass transistors 27.

The signal ATDn, inverted in an inverter 29, is also sent in input to the gate terminal of the N-type transistor of the pair of pass transistors 27. The output of the pair of pass transistors 27 is sent, together with the signal EQ, through a NOR gate 30, whose output is inverted in an inverter 31 to produce the signal HZ.

The chart of FIG. 8 will be explained in relation to the explanation of the operation of the architecture according to the invention. With reference to the above figures, the operation of the architecture according to the invention is as follows.

Instead of the conventional reference columns, whose number matches the number of bits of the word of the memory matrix, the architecture according to the invention uses a single reference line ROW-REF for each half-matrix, with a consequent reduction in the number of reference lines. In a memory device with words of, for example, 16 bits, conventional architectures in fact provide 16 reference columns, one for each word bit. For redundancy lines, like word lines, the reference line is located in the opposite half-plane, and like the word bit, it has its own dedicated sense amplifier, with the same management circuits.

The memory matrix, which is divided into two half-matrices, is activated so that the selection of a generic word line of the matrix in one of the two sections associates, in the opposite section, the corresponding reference cell to check the status of the cell involved in the reading operation. The reference cell is located at the bit line to which the selected memory cell belongs, in the same position with respect to the ground line. Simultaneously, a number of cells equal to the word bits is activated by reference line ROW-REF.

This organization fully balances the two reading paths that are compared, i.e., the path in the left half-matrix $1_L$ and the path in the right half-matrix $1_R$ including the selection paths and their ohmic parameters, capacitive loads, and signal propagations. These paths are interchangeable.

Furthermore, in a conventional case, when there is a defective memory cell on one of the reference bit lines, it is necessary to reject the device, since it is impossible to apply redundancy to the reference columns. However, in the case of the architecture according to the invention, this does not occur because redundancy includes the two half-matrix reference lines and the corresponding reference cells. The redundancy mechanism in fact results in not only the replacement of the defective line but also the replacement of the corresponding reference cell on the reference line ROW-REF. Therefore, the architecture according to the invention for the memory device avoids rejection of the device due to defective reference bits.

The selected reference line ROW-REF is activated at the end of the pulse of ATD. The propagation lines ROW-PROP, synchronously with the activation of the reference lines ROW-REF and on their same half-plane (i.e., if the reference line is taken in the left half-plane, the propagation line is also taken in the left half-plane, and vice versa), monitor the propagation of a generic word line of the matrix, because they reproduce its capacitive loads, its ohmic paths, and the associated delays, so as to assuredly produce the appropriate timings for data reading by the sense amplifier 2.

Furthermore, the architecture according to the invention:

selects the side which, at that moment, is considered the matrix side, the other side acting as reference;

performs synchronization with fundamental timing signals, such as ATD, PC, EQ, and HZ;

provides synchronization with transfer of the read data; and buffers the data transmission lines.

With reference now to FIG. 1 and more particularly to FIGS. 3–8, the sense amplifier 2 receives the signals that arrive from the selection of the bit lines in either of the half-matrices $1_L$ and $1_R$. These signals, designated by L-YMS and R-YMS, are buffered in the sense amplifier to be released with appropriate timings. In particular, the release of the data of the sense amplifier is controlled by the signals LEFT and RIGHT, which indicate the side of the matrix that is involved in the reading operation.

The signals LEFT and RIGHT are generated, for example, according to a first embodiment, by the circuit of FIG. 4, in which, if the equalization signal is high (EQ=1), then LEFT and RIGHT are low and no reading occurs since the equalization step has not ended yet.

In other words, the nodes of the storage structure of the sense amplifier are still perfectly balanced, and this prevents detection of any difference in value, however small, on the two matrix and reference branches that are connected to the sense amplifier 2.

When EQ=0, then:

if A-LEFT=1, A-RIGHT=0→LEFT=1 and RIGHT=0

In these conditions, the tristate structure $8_L$ of FIG. 3 is at high impedance, whereas the tristate structure $8_R$ is at low impedance. In this case, therefore, the data that arrive from the right half-matrix $1_R$ are allowed to pass. The signal that passes is therefore SA-R and the signal SA-OUT indeed reflects the signal.

Also when EQ=0, if:

A-LEFT=0, A-RIGHT=1→RIGHT=1 and LEFT=0, then the signal SA-L passes.

At this point, when HZ=0, the transmission of the data from the memory matrix to the internal bus DATA-BUS is enabled. When instead, HZ=1, the tristate structure 10 is at high impedance thus preventing access to the internal bus DATA-BUS. In this manner, if data reading is not enabled yet, the internal bus DATA-BUS, being disengaged from the sense amplifier 2, remains in an independent condition and can be used for auxiliary purposes, other than the transmission of data of the memory matrix.

The signal HZ is generated by the circuit shown in FIG. 7. This generation is correlated to the presence of the signal ATDn. If signal ATDn is low, the transistor 28 is on, the pair of pass transistors 27 is off, and a high level, equal to the supply voltage, together with the signal EQ, is provided at in input to the NOR gate 30. At this point, if the signal EQ is also high, then the output of the NOR gate 30 is low and the signal HZ is therefore high (HZ=1). In this condition, the tristate structure 10 is in a high-impedance condition and access to the internal bus DATA-BUS is denied.

In contrast, if ATDn is high and EQ is low, then HZ=0 and access of the data, represented by SA-OUT, to the internal bus DATA-BUS is permitted.

Figure 8:
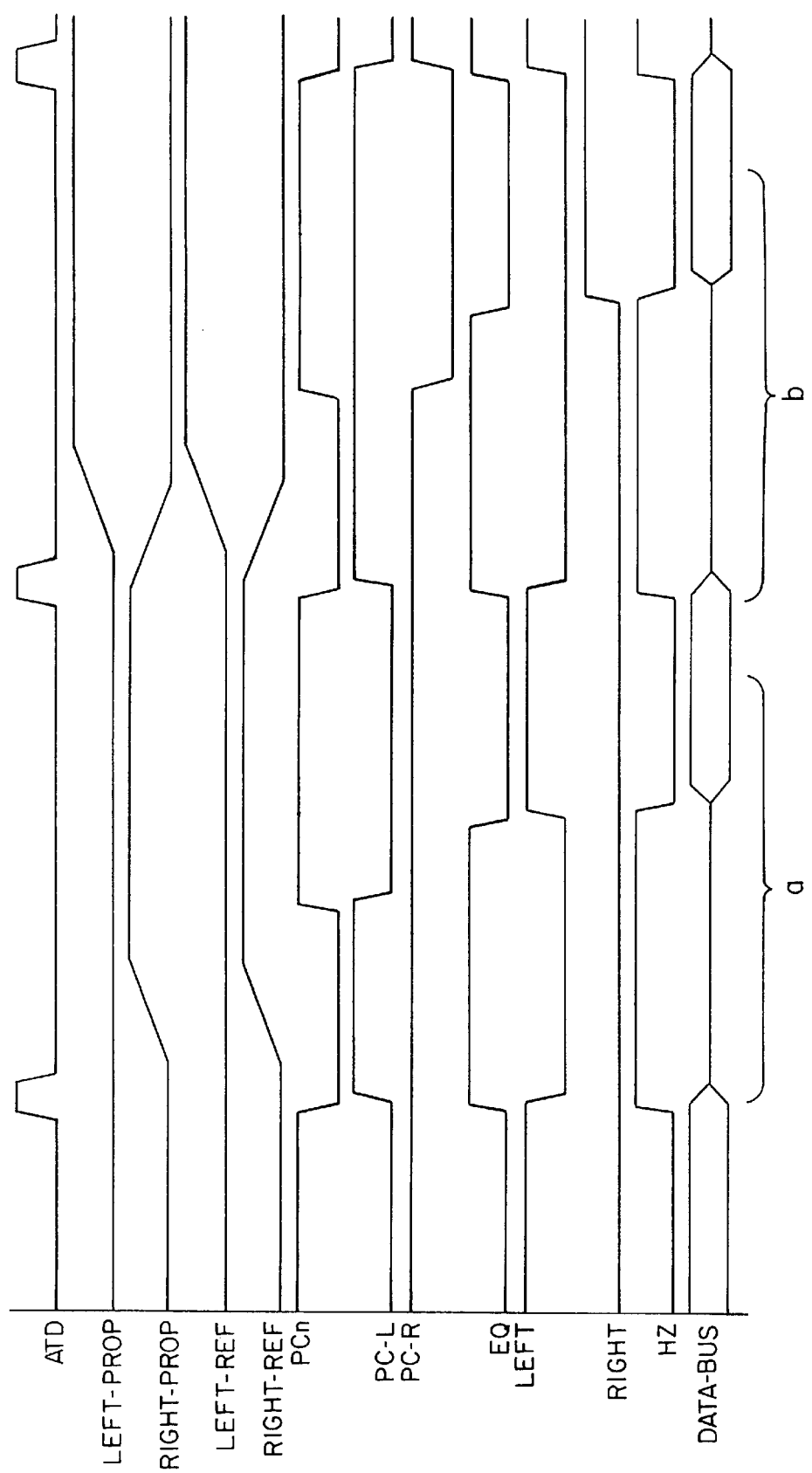
FIG. 8 is a chart of the timings of the signals that are present in the architecture of the memory device according to the invention.

It can be seen, also from the timing chart of FIG. 8, that access to the internal bus DATA-BUS is enabled only at the end of the equalization step (EQ=0).

The generation of the signals LEFT and RIGHT is shown in FIGS. 4 and 5. FIG. 4 illustrates a first possible circuit for producing the signals LEFT and RIGHT, which selects a matrix side to be read when the equalization signal EQ is zero. If EQ=1, then LEFT and RIGHT are zero, since the data are not yet ready for reading.

The circuit of FIG. 5 instead illustrates a case in which two precharging control points (precharging signals PC-L and PC-R), one for each side of the sense amplifier, are produced. If a single precharging control point is used, then it is sufficient to have a single inverter to invert the precharging signal PC.

In the case of two precharging control signals, two NAND gates $14_R$ and $14_L$ combined with PCn are necessary.

The following cases occur:

if PCn=0→PC-R =PC-L=1 if PCn=1, A-RIGHT=1, A-LEFT=0→PC-R=0, PC-L=1;

PCn=1, A-RIGHT=0, A-LEFT=1→PC-R=1, PC-L=0.

The timings of these signals are clearly shown in FIG. 8. In particular, it can be noted that the transmission of the data on the DATA-BUS is timed by the signal HZ=0 and by the signal EQ=0.

Let us now consider the case in which a data item is to be read in the left half-matrix $1_L$. When the signal EQ becomes high (at a pulse of ATD), and the left side precharging signal PC-L is high, then the signal RIGHT-REF becomes high, i.e., the reference is taken in the right side of the matrix (right half-matrix $1_R$), since a data item must be read in the left half-matrix $1_L$.

During this step, the signal LEFT becomes low, since the data are not yet ready for reading (they will be when EQ=0). The signal RIGHT is low.

Since RIGHT-REF is high, the signal LEFT-REF is low, the signal RIGHT-PROP becomes high, and the signal LEFT-PROP is low. The signal RIGHT-PROP indicates the propagation in the right side of the matrix to match the paths of the left side affected by the reading operation. The signal for precharging the left side PC-L becomes zero before the signal EQ also becomes zero. Then, when the signal EQ and the signal HZ become zero, transmission of the data on the DATA-BUS occurs. The above described steps are generally designated by the reference "a".

The reference "b" indicates a similar succession of timings, but for reading the right side of the matrix (half-matrix $1_R$).

In practice, it has been observed that the architecture according to the invention fully achieves the intended aim, since it provides a memory device in which the capacitive loads of each bit line are perfectly balanced with respect to the corresponding reference line. Furthermore, the number of reference lines is considerably reduced (in the case of a memory with 16-bit words, from sixteen to two).

The introduction of lines for reproducing the propagation of a generic word line of the matrix (one propagation line per half-matrix) allows the architecture, synchronously with the activation of the reference lines and on the same plane as the reference lines, to control the propagation of a generic word line so as to determine when full propagation occurs on a given word line, in order to produce with certainty the timings for correct data reading.

The possibility of applying redundancy to defective reference bits allows the memory device to be still usable, differently from what occurs with memory devices with conventional architecture that use reference columns instead of the two reference lines according to the invention.

The buffering structures allows the architecture to transfer the data in an orderly fashion and synchronously with the events, from the memory on an internal bus.

The architecture thus conceived is capable of numerous modifications and variations, all of which are within the scope of the inventive concept. Thus, for example, the tristate structure 10 can be replaced with a pair of pass transistors. Furthermore, the memory matrix can be divided into an even number, higher than two, of half-matrices without modifying the essential concepts of the invention. Finally, all the details may be replaced with other technically equivalent elements.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. Data reading path management architecture for a memory device, particularly of the non-volatile type, comprising a memory matrix and data sensing means for reading data of said memory matrix, wherein said memory matrix is divided into at least two half-matrices, each one of said two half-matrices having a reference line operative to provide a reference signal to the data sensing means for reading the other of said two half-matrices, said data sensing means receiving data from one half-matrix and the reference signal from the other half-matrix, said data sensing means being operative to transmit, according to timing control signals, the data to an internal bus;

wherein the apparatus further comprises for each one of said at least two half-matrices, a propagation line operative to reproduce propagation of a signal along a generic word line of said at least two half-matrices, such as to produce appropriate timing for the reading of said memory matrix.

2. Architecture according to claim 1, wherein said at least two half-matrices comprise a first half-matrix and a second half-matrix, said first and second half-matrices being interchangeable and operative such that the reference line is taken in the second half-matrix when data is read from the first half-matrix and the reference line is taken in the first half-matrix when data is read from the second half-matrix.

3. Architecture according to claim 1, wherein said propagation line is disconnected from bit lines of each one of said at least two memory half-matrices.

4. Architecture according to claim 1, wherein each one of said at least two memory half-matrices comprises redundancy lines.

5. Architecture according to claim 4, wherein for said redundancy lines of each one of said at least two memory half-matrices there is a redundancy data sensing means, a redundancy reference line, and a redundancy propagation reproduction line, said redundancy data sensing means, said redundancy propagation reproduction line, and said redundancy reference line being identical to corresponding structures for the generic word lines of said memory half-matrices.

6. Architecture according to claim 5, wherein said redundancy data sensing means are operative to transmit data of the redundancy lines on said internal bus.

7. Architecture according to claim 1, wherein said data sensing means comprise sense amplifiers.

8. Architecture according to claim 7, further comprising logic means for selecting outputs of said sense amplifiers, said logic means being operative to select one of said at least two half-matrices for reading from said data sensing means.

9. Architecture according to claim 8, wherein said logic means for selecting the outputs of said data sensing means is driven by two precharging control signals, one precharging control signal corresponding to each half-matrix.

10. Architecture according to claim 1, further comprising means for enabling and disabling the transfer of said data of said at least two half-matrices from said data sensing means.

11. Architecture according to claim 10, wherein said means for enabling and disabling the transfer of the data of said at least two half-matrices from said data sensing means comprise tristate structures.

12. Architecture according to claim 1, further comprising means for enabling and disabling access to said internal bus by the data read from said at least two memory half-matrices.

13. Architecture according to claim 12, wherein said means for enabling and disabling access to said internal bus by the data of said at least two memory half-matrices comprise a tristate structure that is driven by a signal for enabling and disabling access to said internal bus.

14. Architecture according to claim 12, wherein said means for enabling and disabling access to said internal bus by the data of said at least two memory half-matrices comprise a pair of pass transistors driven by a signal for enabling and disabling access to said internal bus.

15. Architecture according to claim 1, further comprising means for generating a signal for enabling and disabling access to said internal bus by the data of said at least two memory half-matrices.

16. Architecture according to claim 15, wherein said means for generating said signal for enabling and disabling access to the internal bus by the data of said at least two memory half-matrices are driven by a read address transition signal and by an equalization signal.

17. Architecture according to claim 1, wherein each one of said at least two memory half-matrices comprises a line of a one-time programmable type and a column of a one-time programmable type.

18. Architecture according to claim 1, wherein each one of said at least two memory half-matrices comprises means for selecting bit lines.

19. Architecture according to claim 1, wherein said at least two half-matrices are divided into a plurality of half-matrix subsections that are driven by hierarchical decoding means.

20. Architecture according to claim 1, wherein said data sensing means are driven by said timing control signals.

21. Architecture according to claim 1, wherein a number of said data sensing means is equal to the number of word bits of the word lines of said at least two memory half-matrices.

22. A method for reading a memory device, particularly of the non-volatile type, comprising at least two memory half-matrices, the method comprising the steps of:
as a consequence of a pulsed read address transition signal, precharging two branches of a data sensing means to an operating potential and equalizing said two branches so as to hold data in said data sensing means;
producing a signal for disabling access to an internal bus for the transmission of the data of said memory device;
releasing the equalization of said two branches of the data sensing means to allow a transfer of the data of said at least two memory half-matrices from the data sensing means; and
enabling access of said data to said internal bus for the transmission of said data.

23. The method according to claim 22, wherein said step that comprises precharging the branches of the data sensing means and in equalizing said branches includes precharging one of said branches of the data sensing means that corresponds to a memory half-matrix located on an opposite side with respect to the data sensing means from a memory half-matrix which is involved in a reading operation.

24. The method according to claim 22, wherein said precharging and equalization step comprises an additional step that comprises activating a reference line in a memory half-matrix that is opposite to a memory half-matrix which is involved in a reading operation.

25. The method according to claim 22, wherein said precharging and equalization step comprises an additional step that comprises activating a propagation line in a memory half-matrix located laterally opposite with respect to the data sensing means from a memory half-matrix which is involved in a reading operation, said propagation line reproducing a propagation signal of a normal word line of said memory device, so as to give a certain indication of an end of the propagation of the signals in order to perform correct data reading.

26. A system for balancing read paths of a memory device comprising:
first and second memory half matrices, each including a plurality of memory cells;
data sensing means having a first input coupled to receive data from said first memory half-matrix and a second input coupled to receive data from said second half-matrix;
means for selecting, when a memory cell of said first half-matrix is selected for reading, a corresponding reference cell from said second half-matrix; and
means for synchronizing the reading of the memory cell in the first half-matrix, operative to reproduce in the second half-matrix a propagation of a signal from one cell to the next in the first half-matrix during the reading of the memory cell.

27. The system of claim 26, wherein said selecting means comprises one reference line in each half-matrix, and when one memory cell is selected in said first half-matrix for reading, said reference line of said second half-matrix activates a corresponding reference memory cell of said second half-matrix, thereby providing, to the data sensing means, data from said first half-matrix and a corresponding reference signal from said second half-matrix.

28. The system of claim 27, wherein said data sensing means comprises a plurality of sense amplifiers, each having a first output for transmitting data read from said first half-matrix to an internal bus, and a second output for transmitting data read from said second half-matrix to said internal bus.

29. The system of claim 28, further comprising logic means for selecting one of said first and second outputs of each of said sense amplifiers.

30. The system of claim 29, further comprising means for enabling and disabling access to said internal bus for said first and second outputs of each of said sense amplifiers.

31. The system of claim 30, wherein each of said first and second half-matrices comprises redundancy lines.

32. The system of claim 30, wherein said access enabling and disabling means comprises two pass transistors.

33. The system of claim 30, wherein said access enabling and disabling means comprises a tristate structure.

34. The system of claim 29, wherein said logic means comprises tristate structures.

35. The system of claim 26, wherein each of said first and second half-matrices are divided into a plurality of half matrix subsections that are driven by hierarchical decoding means.

36. The system of claim 26, wherein a number of data sensing means is equal to a number of word bits of word lines of said first and second half-matrices.

37. A method for balancing read paths of a memory device having first and second memory half matrices, each including a plurality of memory cells, and a data sensing means having a first input coupled to receive data from said first memory half-matrix and a second input coupled to receive data from said second half-matrix, the method comprising:
selecting one of the plurality of memory cells from the first half-matrix;
selecting a corresponding reference cell in the second half-matrix;
reproducing, on a propagation reproduction line in the second half-matrix, a propagation of a signal from one cell to the next in the first half-matrix during the reading of the memory cell in the first half-matrix;

receiving data from the one of the plurality of memory cells of the first half-matrix at the first input of the data sensing means, the receiving of the data being synchronized by the reproduced propagation signal; and receiving a reference signal from the reference cell in the second half matrix at the second input of the data sensing means, the receiving of the reference signal being synchronized by the reproduced propagation signal.

38. The method of claim 37, wherein said data sensing means includes at least one sense amplifier, the at least one sense amplifier having a first output for transmitting signals from the first half-matrix to an internal bus, and a second output for transmitting signals from the second half-matrix to the internal bus, the method further comprising:

selecting the first output of the at least one sense amplifier for a transmission.

39. The method of claim 38, further comprising:

transmitting, at the first output of the at least one sense amplifier, the data read from said first half-matrix to said internal bus.

40. The method of claim 39, further comprising:

disabling access to the internal bus, such that the transmission of the data read from said first half-matrix is not permitted.

41. The method of claim 40, further comprising:

enabling access to the internal bus, such that the transmission of the data read from said first half-matrix is permitted.

42. The method of claim 41, wherein enabling access to the internal bus is synchronized by the reproduced propagation signal.

* * * * *

UNITED STATES PATENT AND TRADEMARK OFFICE
CERTIFICATE OF CORRECTION

PATENT NO. : 5,946,237
DATED : August 31, 1999
INVENTOR(S) : Luigi Pascucci

It is certified that error appears in the above-identified patent and that said Letters Patent is hereby corrected as shown below:

On the title page, please change the title to read:

NONVOLATILE MEMORY DEVICE CAPABLE OF READING DATA WITH AN APPROPRIATE SELF-TIMING AND A REDUCED NUMBER OF REFERENCE LINES

Signed and Sealed this

First Day of February, 2000

*Attest:*

Q. TODD DICKINSON

*Attesting Officer*     *Acting Commissioner of Patents and Trademarks*